(12) United States Patent
Yamashita et al.

(10) Patent No.: US 9,312,331 B2
(45) Date of Patent: Apr. 12, 2016

(54) SEMICONDUCTOR DEVICE

(71) Applicant: KABUSHIKI KAISHA TOSHIBA, Tokyo (JP)

(72) Inventors: Hiroaki Yamashita, Hakusan Ishikawa (JP); Syotaro Ono, Kanazawa Ishikawa (JP); Hideyuki Ura, Hakusan Ishikawa (JP); Masaru Izumisawa, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/637,170

(22) Filed: Mar. 3, 2015

(65) Prior Publication Data

US 2016/0079351 A1 Mar. 17, 2016

(30) Foreign Application Priority Data

Sep. 16, 2014 (JP) .................................. 2014-187330

(51) Int. Cl.
*H01L 29/06* (2006.01)
*H01L 29/76* (2006.01)
(Continued)

(52) U.S. Cl.
CPC ........ *H01L 29/0634* (2013.01); *H01L 29/0684* (2013.01); *H01L 29/4236* (2013.01);
(Continued)

(58) Field of Classification Search
CPC ............ H01L 29/0634; H01L 29/7813; H01L 29/4236; H01L 29/7397; H01L 29/7811; H01L 29/0684; H01L 29/66348; H01L 29/66734
USPC .......... 257/133, 328, 329, 330, 335.341, 343, 257/488, E29.062, E29.066, E29.255, 257/E29.257, E27.02, E27.06, E27.016, 257/E21.09, E21.352, E21.418; 438/197, 438/268, 279, 400, 481
See application file for complete search history.

(56) References Cited

U.S. PATENT DOCUMENTS 8,575,707 B2 11/2013 Tamaki et al.
2005/0098826 A1* 5/2005 Yamaguchi ......... H01L 29/0634
257/341

(Continued)

FOREIGN PATENT DOCUMENTS

| JP | 2009-087998 | 4/2009 |
| JP | 2012142334 | 7/2012 |
| JP | 2014-003200 | 1/2014 |

OTHER PUBLICATIONS

Korean Office Action dated Nov. 20, 2015, filed in Korean counterpart Patent Application No. 10-2015-0007454, 7 pages (with English translation).

*Primary Examiner* — Dao H Nguyen
(74) *Attorney, Agent, or Firm* — Patterson & Sheridan, LLP

(57) ABSTRACT

A semiconductor device includes a first semiconductor region of a first conductivity type, a second semiconductor region of a second conductivity type provided in the first semiconductor region, an element region, and a termination region. The element region includes a third semiconductor region of the second conductivity type, a fourth semiconductor region of the first conductivity type, and a gate electrode disposed on a gate insulating layer that extends adjacent the third semiconductor region and the fourth semiconductor region. The termination region surrounds the element region and includes a first electrode, which includes first portions extending in a first direction and second portions extending in a second direction. A plurality of first electrodes are provided on the first semiconductor region and the second semiconductor region. An interval between adjacent first portions in the second direction is less than an interval between adjacent second portions in the first direction.

20 Claims, 11 Drawing Sheets

(51) Int. Cl.
*H01L 27/088* (2006.01)
*H01L 27/06* (2006.01)
*H01L 29/739* (2006.01)
*H01L 29/78* (2006.01)
*H01L 29/423* (2006.01)
*H01L 29/66* (2006.01)

(52) U.S. Cl.
CPC .... *H01L29/66348* (2013.01); *H01L 29/66734* (2013.01); *H01L 29/7397* (2013.01); *H01L 29/7811* (2013.01); *H01L 29/7813* (2013.01)

(56) References Cited

U.S. PATENT DOCUMENTS

| | | | | |
|---|---|---|---|---|
| 2013/0234238 A1* | 9/2013 | Hsieh | ........... | H01L 27/0255 257/328 |
| 2013/0248979 A1* | 9/2013 | Ono | ........... | H01L 29/7395 257/329 |
| 2013/0341751 A1* | 12/2013 | Ono | ........... | H01L 23/58 257/488 |
| 2014/0117445 A1* | 5/2014 | Kimura | ........... | H01L 29/0634 257/339 |
| 2015/0349114 A1* | 12/2015 | Miyakoshi | ........... | H01L 29/42372 257/330 |

* cited by examiner

SEMICONDUCTOR DEVICE

CROSS-REFERENCE TO RELATED APPLICATION

This application is based upon and claims the benefit of priority from Japanese Patent Application No. 2014-187330, filed Sep. 16, 2014, the entire contents of which are incorporated herein by reference.

FIELD

Embodiments described herein relate generally to a semiconductor device.

BACKGROUND

A semiconductor device, such as a metal oxide semiconductor field effect transistor (MOSFET,) or an insulated gate bipolar transistor (IGBT), has a super junction structure in which a p-type semiconductor region and an n-type semiconductor region are alternately provided in a drift layer in order to compensate for a design tradeoff between a breakdown voltage and on-resistance (or an on-voltage). By using the structure, it is possible to increase an effective doping concentration of the drift layer and to improve the relationship between the breakdown voltage and the on-resistance (or an on-voltage).

However, in the semiconductor device having the super junction structure in a termination region, when an electric field is applied to a semiconductor region surface of the termination region, ions contained in an insulating layer formed on the semiconductor region of the termination region move in the insulating layer as a result of the electric field. Then, some of the ions moving in the insulating layer locally gather at a region of the insulating layer on the side of the semiconductor region with a strong electric field. As a result, the surface of the semiconductor region is locally charged by the ions gathering in the insulating layer on the side of the semiconductor region. When the surface of the semiconductor region is charged with negative ions in this manner, the depletion layer in the termination region is extended. As a result, an electric field in a region of the outermost periphery of the termination region becomes stronger, and a breakdown voltage of the termination region is degraded. As a result, a breakdown voltage of the semiconductor device is lowered in some cases.

DESCRIPTION OF THE DRAWINGS

FIG. 3A is a cross-sectional view of FIG. 2 along section A-A', and FIG. 3B is a cross-sectional view of FIG. 2 along section B-B'.

FIG. 4A is a cross-sectional view of FIG. 2 along section A-A', and FIG. 4B is a cross-sectional view of FIG. 2 along section B-B'.

FIG. 7A is a cross-sectional view of FIG. 6 along section A-A', and FIG. 7B is a cross-sectional view of FIG. 6 along section B-B'.

FIG. 10A is a cross-sectional view of FIG. 9 along section A-A', and FIG. 10B is a cross-sectional view of FIG. 9 along section B-B'.

DETAILED DESCRIPTION

Figure 1:
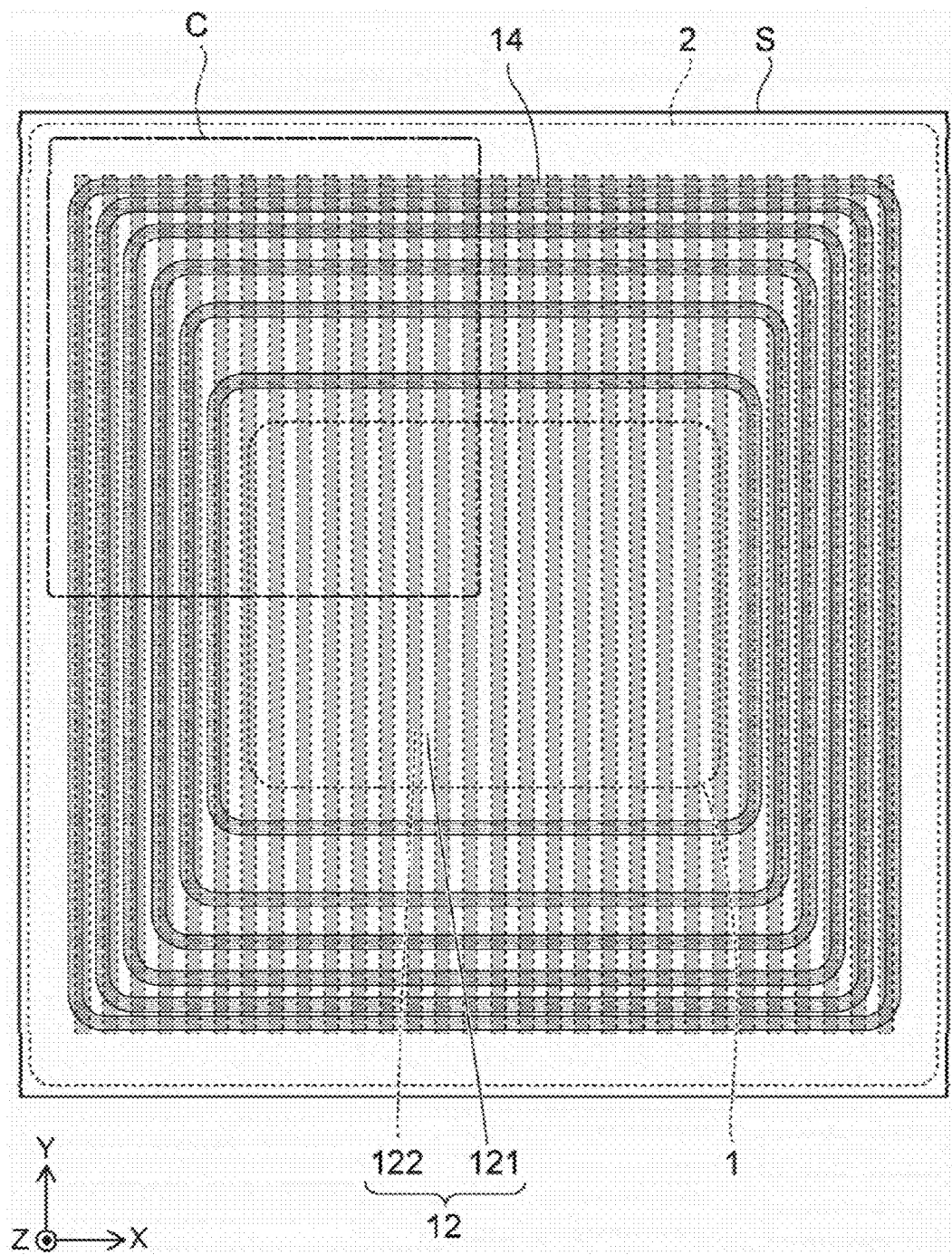
FIG. 1 is a plan view which illustrates a semiconductor device according to a first embodiment.

Embodiments provide a semiconductor device which may suppress a decrease in breakdown voltage.

In general, according to one embodiment, a semiconductor device includes a first semiconductor region of a first conductivity type, a plurality of second semiconductor regions of a second conductivity type extending inwardly of the first semiconductor region, each of the plurality of second semiconductor regions extending in a first direction, and arranged along a second direction crossing the first direction, an element region, and a termination region.

The second semiconductor region is provided in the first semiconductor region. The second semiconductor region extends in a first direction. A plurality of the second semiconductor regions are arranged along a second direction crossing the first direction.

The element region includes a third semiconductor region of the second conductivity type that is provided on the second semiconductor regions, a fourth semiconductor region of the first conductivity type that is selectively provided on the third semiconductor region, and a gate electrode disposed on a gate insulating layer that extends adjacent the third semiconductor region and the fourth semiconductor region.

The termination region surrounds the element region and has a first electrode that includes respective first portions extending in the first direction and second portions extending in the second direction on the first semiconductor region and the second semiconductor region, wherein an interval between adjacent first portions in the second direction is less than an interval between adjacent second portions in the first direction.

Hereinafter, each exemplary embodiment will be described with reference to drawings.

The drawings are schematic or conceptual, such that a relationship between a thickness and a width of each element, and a size ratio between elements are not necessarily the same as those in an actual device. Moreover, when representing the same element, dimensions and ratios may be represented differently in different drawings.

Arrows X, Y, and Z in each drawing represent three directions orthogonal to each other, and for example, a direction (X direction) represented by an arrow X and a direction (Y direction) represented by an arrow Y are directions parallel to a main surface of a semiconductor substrate, and a direction (Z direction) represented by an arrow Z represents a direction perpendicular to the main surface of the semiconductor substrate.

In the exemplary embodiment and each drawing, the same reference numerals are applied to the same elements and some elements that have been previously described in the previous drawings will not be described again for brevity.

Each embodiment described below may be described in terms of p-type and n-type semiconductor regions. However, the conductivity types may be reversed in the semiconductor regions.

First Embodiment

A first embodiment will be described with reference to FIGS. 1 to 4B.

FIG. 1 is a plan view which illustrates a semiconductor device 100 according to a first embodiment.

Figure 2:
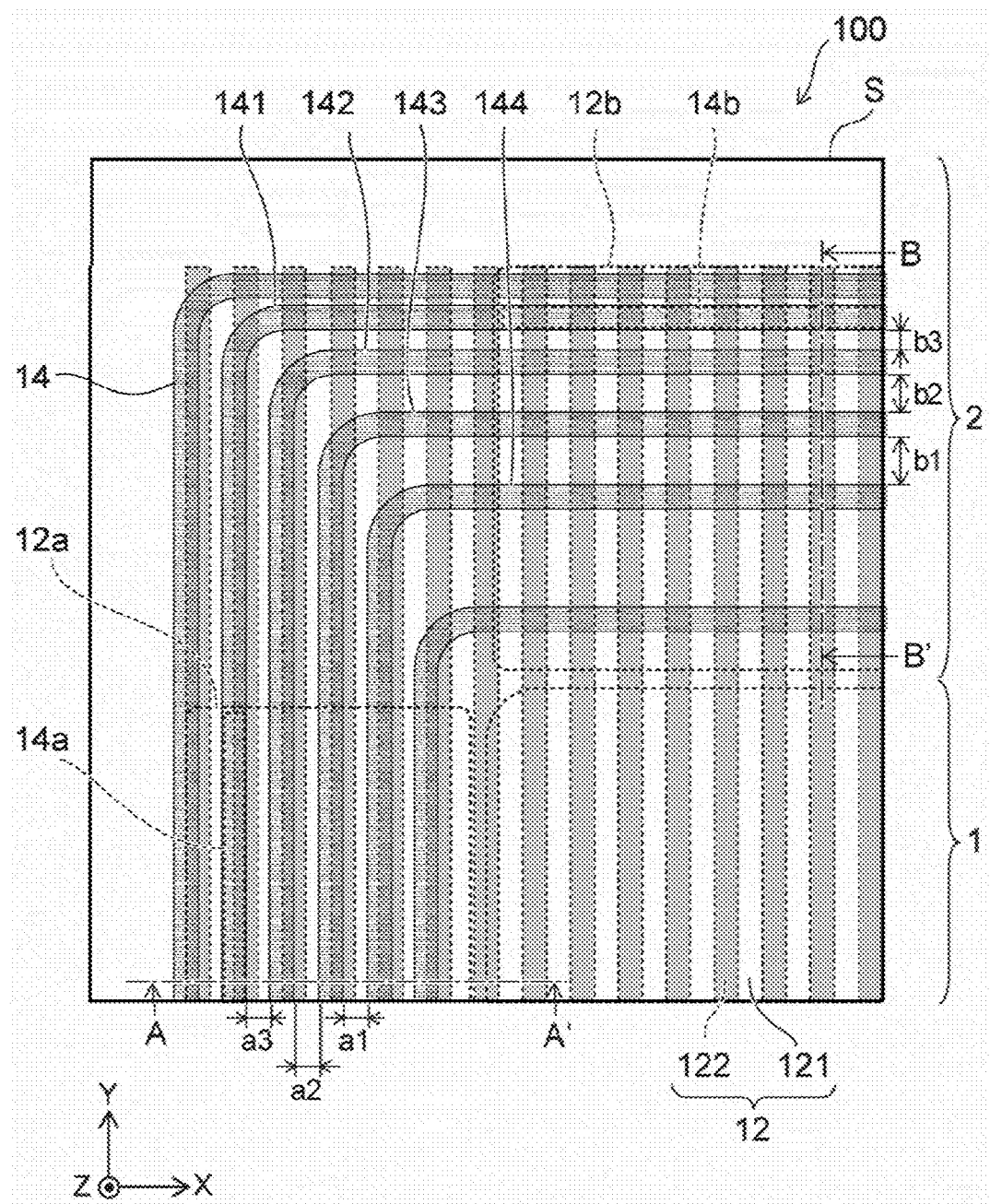
FIG. 2 is a plan view which illustrates a portion of the semiconductor device according to the first embodiment.

FIG. 2 is a plan view which illustrates a portion of the semiconductor device 100 according to the first embodiment. FIG. 2 is an enlarged plan view of a region C of FIG. 1.

Figure 3A:
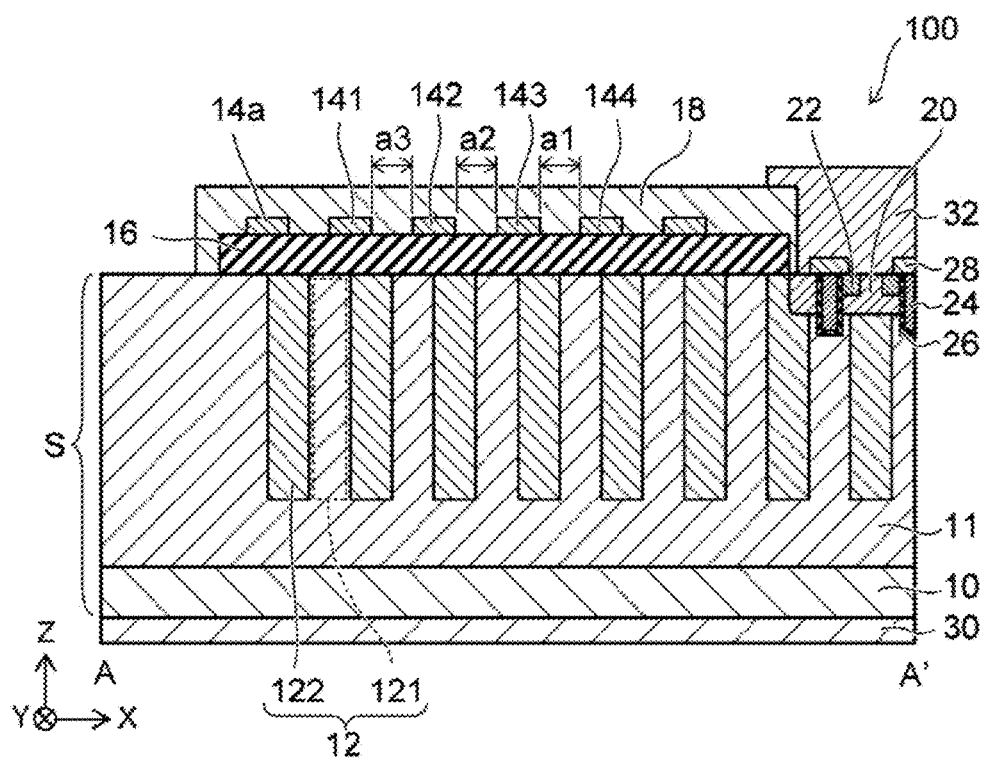
FIGS. 3A and 3B are cross-sectional views which illustrate a portion of the semiconductor device according to the first embodiment.
Figure 3B:
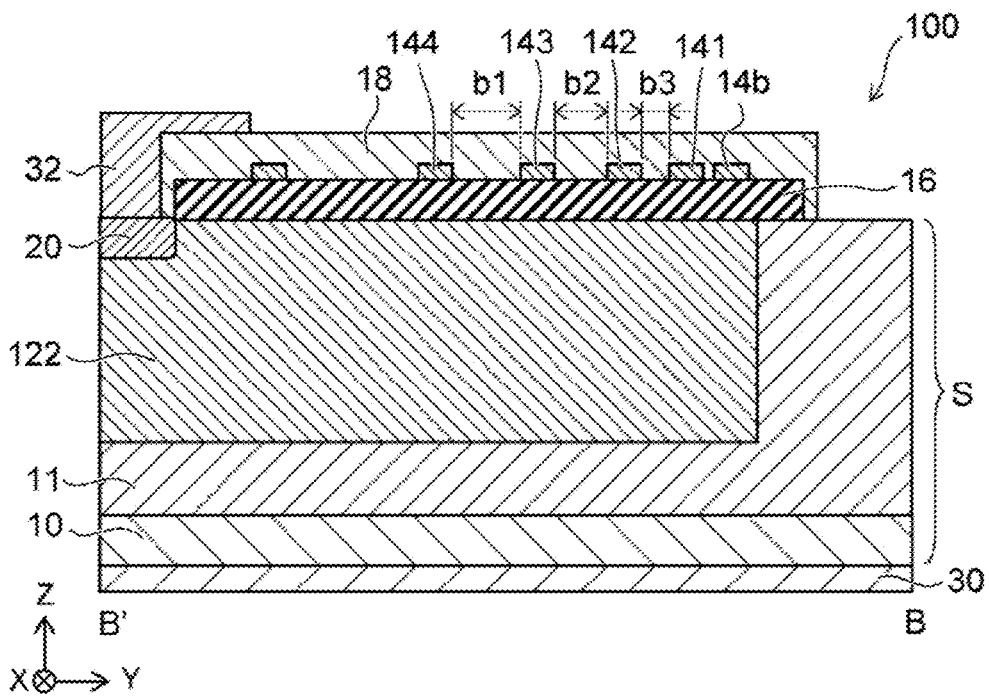

FIGS. 3A and 3B are cross-sectional views which illustrate a portion of the semiconductor device 100 according to the first embodiment.

FIG. 3A is a cross-sectional view of FIG. 2 along section A-A' of FIG. 2, and FIG. 3B is a cross-sectional view of FIG. 2 along section B-B' of FIG. 2.

Figure 4A:
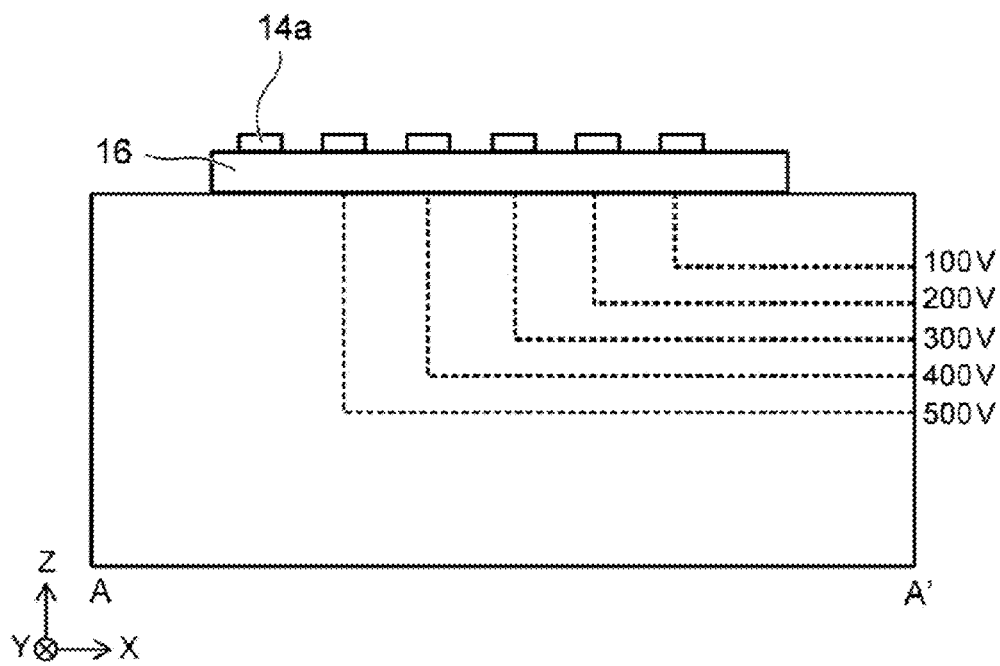
FIGS. 4A and 4B are cross-sectional views which illustrate equipotential lines in a termination region of the semiconductor device according to the first embodiment.
Figure 4B:
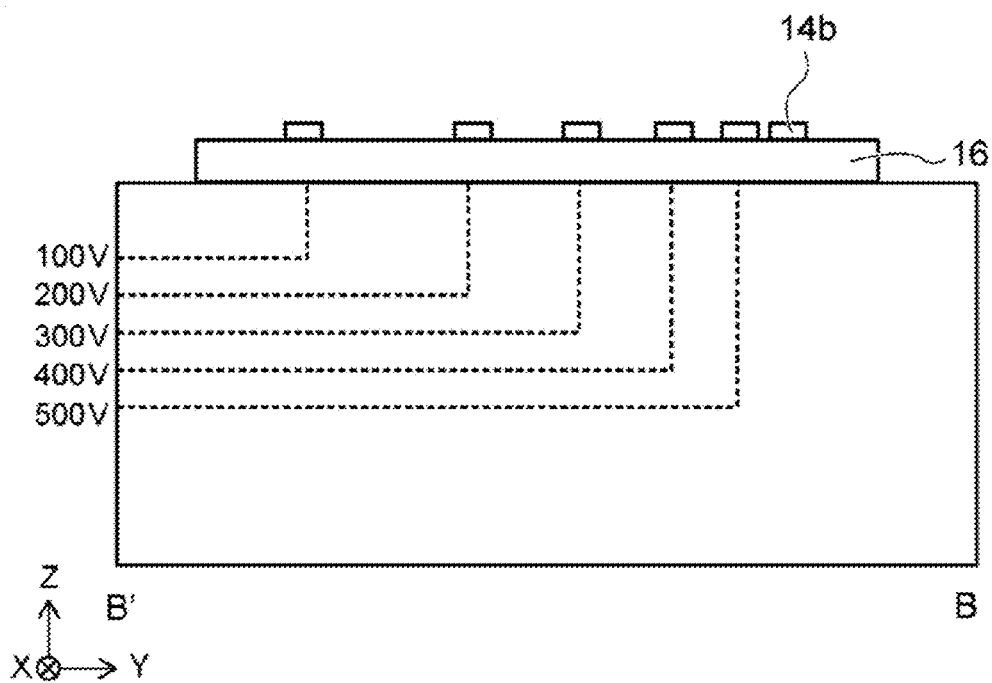

FIGS. 4A and 4B are cross-sectional views which illustrate equipotential lines in a termination region 2 of the semiconductor device 100 according to the first embodiment. FIG. 4A illustrates equipotential lines in a cross-sectional view of FIG. 2 along section A-A' of FIG. 2, and FIG. 4B illustrates equipotential lines in a cross-sectional view of FIG. 2 along section B-B' of FIG. 2.

In FIGS. 1 and 2, in order to describe a positional relationship among an n-type pillar 121, a p-type pillar 122, and a field plate electrode 14 to be described below, a configuration of a portion of the semiconductor device 100 is omitted.

The semiconductor device 100 according to the first embodiment is, for example, a MOSFET.

The semiconductor device 100 according to the first embodiment includes a semiconductor substrate, a gate electrode, a gate insulating layer, a first electrode (field plate electrode 14), a second electrode (drain electrode 30 (shown in FIGS. 3A and 3B)), a third electrode (source electrode 32 (shown in FIGS. 3A and 3B)), and a first insulating layer (insulating layer 16 (shown in FIGS. 3A and 3B)). The semiconductor substrate includes a first semiconductor region (n-type semiconductor region 11 (shown in FIGS. 3A and 3B)) of a first conductivity type, a plurality of second semiconductor regions (p-type pillar 122) of a second conductivity type, a third semiconductor region (base layer 20 (shown in FIGS. 3A and 3B)) of the second conductivity type, a fourth semiconductor region (source region layer 22 (shown in FIG. 3A)) of the first conductivity type, and a fifth semiconductor region (drain layer (shown in FIGS. 3A and 3B)) of the first conductivity type.

A semiconductor substrate S (hereinafter, referred to as a substrate S) has a first main surface (front surface) and a second main surface (rear surface).

In the following, in order to easily describe each embodiment, a region of the substrate S in which a base layer 20 or a source region layer 22 is included, and a MOSFET is formed, is referred to as an element region 1. Moreover, with respect to the element region 1, a region at an outer edge side of the substrate S is referred to as a termination region 2.

As illustrated in FIGS. 1 and 2, the element region 1 is surrounded by the termination region 2.

As illustrated in FIGS. 3A and 3B, the source electrode 32 is provided on a front surface of the substrate S. The drain electrode 30 is provided on the rear surface of the substrate S.

The drain layer 10 is provided on the rear surface side of the substrate S. The drain layer 10 is provided in the element region 1 and the termination region 2. The drain layer 10 is an n-type semiconductor region. The drain layer 10 is electrically connected to the drain electrode 30.

The n-type semiconductor region 11 is provided on the drain layer 10. An n-type dopant concentration of the n-type semiconductor region 11 is lower than an n-type dopant concentration of the drain layer 10.

The p-type pillar 122 is selectively provided on the n-type semiconductor region 11. A plurality of the p-type pillars 122 are provided and are spaced apart in an X direction. The p-type pillars 122 are provided at equal intervals, for example, in the X direction.

A p-type dopant concentration of the p-type pillar 122 is higher than, for example, an n-type dopant concentration of the n-type semiconductor region 11. However, the p-type dopant concentration of the p-type pillar 122 may be equal to the n-type dopant concentration of the n-type semiconductor region 11.

The region between each of the adjacent p-type pillars 122 in the n-type semiconductor region 11 corresponds to the n-type pillar 121. The n-type pillar 121 and the p-type pillar 122 are alternately provided adjacent to one another in the X direction.

In a following description, the n-type pillar 121 and the p-type pillar 122 are collectively referred to as a semiconductor region 12.

For example, the n-type semiconductor region 11 is a region which included as a single n-type semiconductor layer or as a stacked body of the n-type semiconductor substrate and an n-type semiconductor layer provided on an n-type semiconductor substrate, and an n-type pillar 121 extends between each of the p-type pillars 122 formed on the n-type semiconductor region 11. As an example, the n-type semiconductor region 11 and the p-type pillar 122 are formed by forming the n-type semiconductor layer, forming trenches inwardly of the front surface of the n-type semiconductor layer, and embedding the p-type semiconductor in the trenches. At this time, the p-type semiconductor layer embedded in the trench is the p-type pillar 122, and the remaining n-type semiconductor layer below the p type pillars 122 is the n-type semiconductor region 11. The region between the p-type pillars 122 in the n-type semiconductor region 11 is the n-type pillar 121.

As illustrated in FIG. 2, the n-type pillars 121 and the p-type pillars 122 are provided and extend across both the element region 1 and the termination region 2.

The n-type pillars 121 and the p-type pillars 122 extend in a Y direction in the element region 1 and the termination region 2.

A base region layer 20 is provided on the p-type pillar 122 on the front surface side of the substrate S. The base region layer 20 is provided in the element region 1. A part of the base region layer 20 is provided on the n-type pillar 121. The base region layer 20 is a p-type semiconductor region.

The source region layer 22 is selectively provided on the base region layer 20 on the front surface side of the substrate S. The source region layer 22 is provided in the element region 1. The source region layer 22 is an n-type semiconductor region. An n-type dopant concentration of the source region layer 22 is higher than an n-type dopant concentration of the n-type semiconductor region 11. In addition, the n-type dopant concentration of the source region layer 22 is higher than an n-type dopant concentration of the n-type pillar 121.

A gate electrode 24 is located to either side of, and spaced from, the p-type pillar on which the base region 20 is formed, and each gate electrode extends in a trench disposed on either side of the p-type pillar on which the base region 20 is formed and past the base layer 20, and one of the source region layers 22 and terminates inwardly of the n-type pillar 121. A gate insulating layer 26 lines the trench to electrically insulate the gate electrode from the base layer 20, the source region layer 22 and the n-type pillar.

The source electrode 32 is provided on the base layer 20 and the source region layer 22. The source region layer 22 is electrically connected to the source electrode 32.

An insulating layer 28 is provided between the gate electrode 24 and the source electrode 32. The gate electrode 24 is insulated from the source electrode 32 by the insulating layer 28.

The MOSFET is turned on by a voltage equal to or more than a threshold voltage value applied to the gate electrode 24. At this time, a channel (inversion layer) is formed in a region of the base layer 20 in a vicinity of the gate insulating layer 26.

When the MOSFET is in an off state, and a positive potential is applied to the drain electrode 30 with respect to a potential of the source electrode 32, a depletion layer is spread into the n-type pillar 121 and the p-type pillar 122 from a pn junction surface of the n-type pillar 121 and the p-type pillar 122. The n-type pillar 121 and the p-type pillar 122 are depleted in a vertical direction with respect to a junction surface of the n-type pillar 121 and the p-type pillar 122. The depletion layer suppresses the electric field concentration along a direction parallel to the junction surface of the n-type pillar 121 and the p-type pillar 122, and thus a high breakdown voltage is obtained.

A field plate electrode 14 is provided on the outer edge side of the substrate S above an insulating layer 16 extending over the n-types pillar 121 and the p-type pillars 122, and surrounding the base layer 20 and the source region layer 22. The field plate electrode 14 is covered with an insulating layer 18. The field plate electrode 14 is, for example, an electrode having a floating potential. The field plate electrode 14 is configured as, for example, a doped polycrystalline silicon.

A plurality of the field plate electrodes 14 is formed in the termination region 2, so as to surround the element region 1. The field plate electrode 14 suppresses the forming of the depletion layer in the termination region 2 at an outer periphery (dicing line) of the termination region 2. In addition, the field plate electrode 14 reduces electric field strength at a boundary of the n-type pillars 121 and the p-type pillars 122.

The field plate electrode 14 includes a first portion 14a and a second portion 14b.

The first portion 14a is provided above a region 12a of a semiconductor region 12 which is spaced in the X direction from the element region 1.

The second portion 14b is provided above a region 12b of the semiconductor region 12, which is spaced in the Y direction from the element region 1.

The first portion 14a extends in the Y direction and thus parallel to the n-type doped regions and p-type doped regions 121, 122. A plurality of the first portions 14a are formed parallel to one another in the X direction.

The second portion 14b extends in the X direction. A direction in which the second portion 14b extends is orthogonal to a direction in which the first portion 14a extends. A plurality of the second portions 14b are formed parallel to one another in the Y direction and are extensions of the first portions 14a.

The first portion 14a is provided above an interface (border or contact region) between, for example, the n-type pillar 121 and the p-type pillar 122. Specifically, the first portion 14a is provided above an interface between the p-type pillar 122 and the n-type pillar 121 on an opposite side as the element region 1 side of the p-type pillar 122. In other words, the first portion 14a is provided above an interface between the p-type pillar 122 and the n-type pillar 121 which is adjacent to the p-type pillar 122 on the termination region 2 side of the element region 1.

An interval (pitch) of adjacent first portions 14a in the X direction is, for example, constant. In an example illustrated in FIG. 2, an interval a3 between the first portion 14a of the field plate electrode 141 and the first portion 14a of the field plate electrode 142 in the X direction is equal to an interval a2 between the first portion 14a of the field plate electrode 142 and the first portion 14a of the field plate electrode 143 in the X direction. Likewise, the interval a2 is equal to the interval a1.

Each of the first portions 14a are provided to electrically couple a pair of adjacent n-type pillars 121 and the p-type pillars 122.

Next, an interval between adjacent second portions 14b in the Y direction will be described.

First, as in examples illustrated in FIGS. 1 to 4B, a case where the p-type dopant concentration of the p-type pillar 122 is greater than the n-type dopant concentration of the n-type pillar 121 will be described. In this case, the interval (spacing) in the Y direction between adjacent second portions 14b becomes wider (greater) as the field plate electrodes 14 approach closer to the element region 1. That is, as illustrated in FIG. 2, the interval between adjacent second portions 14b in the Y direction at a position near the center of the substrate S is wider (greater) than an interval between adjacent second portions 14b in the Y direction at a position close to the outer edge of the substrate S.

Using an example illustrated in FIG. 2, when the p-type dopant concentration of the p-type pillar 122 is greater than the n-type dopant concentration of the n-type pillar 121, an interval b3, in the Y direction, between the second portion 14b of the field plate electrode 141 and a second portion of the field plate electrode 142 is less than an interval b2, in the Y direction, between the second portion 14b of the field plate electrode 142 and a second portion of the field plate electrode 143. The interval b2, in the Y direction, is less than an interval b1, in the Y direction, between the second portion 14b of the field plate electrode 143 and a second portion of the field plate electrode 144.

As another example, a case where the n-type dopant concentration of the n-type pillar 121 is greater than the p-type dopant concentration of the p-type pillar 122 will be described. In this case, the interval between adjacent second portions 14b in the Y direction is greater as the field plate electrodes 14 are farther from the element region 1. That is, the interval between second portions 14b adjacent to one another in the Y direction at a position near the center of the substrate S is less than the interval of adjacent second portions 14b in the Y direction at a position close to the outer edge of the substrate S. In this case, the interval b3 is wider than the interval b2, and the interval b2 is wider than the interval b1.

As another example, when the n-type dopant concentration of the n-type pillar 121 is equal to the p-type dopant concentration of the p-type pillar 122, the interval between adjacent second portions 14b in the Y direction is constant (equal). In this case, the interval b3 is equal to the interval b2, and the interval b2 is equal to the interval b1. Similarly, the interval a1 is narrower than the interval b1. In the same manner, the interval a2 is narrower than the interval b2, and the interval a3 is narrower than the interval b3.

This is because a depletion layer is more likely to extend in the same direction in which the n-type pillar 121 and the p-type pillar 122 extend as opposed to a direction in which the n-type pillar 121 and the p-type pillar 122 are formed alternately and in contact with one another.

Accordingly, in any type of relationship between the n-type dopant concentration of the n-type pillar 121 and the p-type dopant concentration of the p-type pillar 122 as described above, an interval between at least two of adjacent first portions 14a in the X direction is narrower than an interval between at least two of adjacent second portions 14b in the Y direction. For example, in an example illustrated in FIG. 2, the interval a3 is wider than the interval b3. However, the interval a2 is narrower than the interval b2. In addition, the interval a1 is narrower than the interval b1.

Then, with reference to FIGS. 4A and 4B, the distribution of potentials in the termination region 2 will be described. In a case where the p-type dopant concentration of the p-type pillar 122 is greater than the n-type dopant concentration of the n-type pillar 121, FIGS. 4A and 4B illustrate the distribution of potentials in the termination region 2 when the semiconductor device 100 is turned off, and a positive potential is applied to the drain electrode 30 with respect to a potential of the source electrode 32.

Equipotential lines of FIGS. 4A and 4B are described for each fixed potential. As an example, the equipotential lines illustrated in FIGS. 4A and 4B show a potential of 100 V, 200 V, 300 V, 400 V, and 500 V in an order approaching the element region 1.

In FIGS. 4A and 4B, each pillar region, a base layer, a gate electrode, and the like are omitted for clarity.

As illustrated in FIG. 4A, an interval between equipotential lines in the X direction is substantially constant in a region 12a of the semiconductor region 12 (shown in FIG. 2).

In contrast, as illustrated in FIG. 4B, an interval between equipotential lines in the Y direction is not constant in a region 12b of the semiconductor region 12 (shown in FIG. 2). Specifically, an interval between equipotential lines closer to the element region 1 is greater than an interval between equipotential lines farther from the element region 1.

In addition, an interval between equipotential lines of 100 V to 400 V of the region 12b in the Y direction is wider than an interval between equipotential lines of the region 12a in the X direction. An interval between equipotential lines of 400 V and 500 V of the region 12b in the Y direction is narrower than an interval between equipotential lines of the region 12a in the X direction.

This is because a depletion layer is more likely to extend in the same direction in which the n-type pillar 121 and the p-type pillar 122 extend than in the direction in which the n-type pillar 121 and the p-type pillar 122 are alternately formed next to each other.

Here, as a comparative example of the semiconductor device 100 according to the embodiment, it is considered that the interval between adjacent second portions 14b in the Y direction is equal to the interval between adjacent first portions 14a in the X direction.

As described above, likelihood of extension of the depletion layer in the region 12a is different from that in the region 12b, such that an interval between equipotential lines in the region 12a is different from an interval in the region 12b.

Accordingly, in this case, a potential of a region facing the first portion 14a of any one of the field plate electrodes 14 of the semiconductor region 12 in a Z direction is greatly different from a potential of a region facing the second portion 14b of the field plate electrode 14 in the Z direction.

As a result, a potential of the field plate electrode 14 is a substantially intermediate potential between a potential of the region 12a and a potential of the region 12b. When the potential of the field plate electrode 14 is different from a potential of the semiconductor region 12 right under the field plate electrode 14, an electric field forms between the field plate electrode 14 and the semiconductor region 12. Ions contained in the insulating layer 16 move to the semiconductor region 12 side of the insulating layer 16 due to the electric field between the field plate electrode and the semiconductor region 12. A front surface of the semiconductor region 12 is electrified by the ions which moved to the semiconductor region 12 side of the insulating layer 16. The charging of the front surface of the semiconductor region 12 affects an electric field in the semiconductor region 12. As a result, extension of the depletion layer in the termination region 2 of the semiconductor device is changed and the device has a lower a breakdown voltage in some cases.

In contrast, an interval between at least two adjacent first portions 14a in the X direction is less than an interval between at least two of adjacent second portions 14b in the Y direction according to the exemplary embodiment. That is, the semiconductor device 100 includes a plurality of the field plate electrodes 14 in which an interval between adjacent first portions 14a in the X direction is less than an interval between adjacent second portions 14b in the Y direction.

As illustrated in FIG. 2, the field plate electrodes 14 are, for example, field plate electrodes 142, 143, and 144. In these field plate electrodes 14, the interval a1 is less than the interval b1. In addition, the interval a2 is less than the interval b2.

Therefore, it is possible to reduce a difference between a potential of a region facing first portions 14a of a field plate electrode 144 in the Z direction and a potential of a region facing second portions 14b in the Z direction. Alternatively, it is possible to reduce a difference between a potential of a region facing first portions 14a of a field plate electrode 143 in the Z direction and a potential of a region facing second portions 14b in the Z direction.

As a result, an electric field occurring between the field plate electrode 14 and the semiconductor region 12 becomes weak, and an electrification on the front surface of the semiconductor region 12 is reduced. As a result, it is possible to suppress lowering of the breakdown voltage in a semiconductor device.

When the n-type dopant concentration of the n-type pillar 121 is greater than the p-type dopant concentration of the p-type pillar 122, an interval between at least two of adjacent first portions 14a in the X direction is less than an interval between at least two of adjacent second portions 14b in the Y direction, making it is possible to suppress the lowering of breakdown voltage in the semiconductor device.

In this case, as described above, an interval between adjacent second portions 14b in the Y direction at a position farther from the outer edge of the substrate S is less than an interval between adjacent second portions 14b in the Y direction at a position near the outer edge of the substrate S.

Accordingly, the interval between adjacent first portions 14a in the X direction is made to be less than the interval between adjacent second portions 14b in the Y direction at a position near the outer edge of the substrate S, making it is possible to weaken an electric field occurring between the field plate electrode 14 and the semiconductor region 12.

Moreover, in order to weaken the electric field occurring between the field plate electrode 14 and the semiconductor region 12, it is desirable to have the interval in the Y direction between adjacent second portions 14b be different (i.e., the position closer to the element region 1 and a position farther away from the element region 1). This is because an interval between equipotential lines of the region 12b in the Y direction at a position close to the element region 1 is different from an interval between equipotential lines of the region 12b in the Y direction at a position away from the element region 1 according to a relationship between, for example, the n-type dopant concentration of the n-type pillar 121 and the p-type dopant concentration of the p-type pillar 122.

For example, when the p-type dopant concentration of the p-type pillar 122 is greater than the n-type dopant concentration of the n-type pillar 121, the interval in the Y direction between adjacent second portions 14b becomes wider as the field plate electrodes 14 are positioned closer to the element region 1, making it is possible to provide the field plate electrode 14 along equipotential lines. As a result, it is possible to further reduce a difference between a potential of a region facing the first portions 14a of any one of the field plate electrodes 14 in the Z direction, and a potential of a region facing the second portions 14b of the field plate electrode 14 in the Z direction, in the semiconductor region 12.

When the n-type dopant concentration of the n-type pillar 121 is greater than the p-type dopant concentration of the p-type pillar 122, the interval in the Y direction between adjacent second portions 14b is wider the closer the field plate electrodes 14 are to the element region 1, making it possible to provide the field plate electrode 14 along the equipotential lines.

In addition, in the n-type pillar 121 and the p-type pillar 122, an interface between the p-type pillar 122 and the n-type pillar 121 adjacent to the p-type pillar 122 in a direction toward the termination region 2 from the element region 1 has a strong electric field as compared to other regions. The first portions 14a are provided along the interface as described above, and thereby it is possible to shield an electric field in the interface from the outside to the inside. Therefore, it is possible to move ions in the insulating layer 16 by the electric field in the interface to suppress electrification of the front surface of the semiconductor region 12.

Second Embodiment

Next, a second embodiment will be described with reference to FIG. 5.

Figure 5:
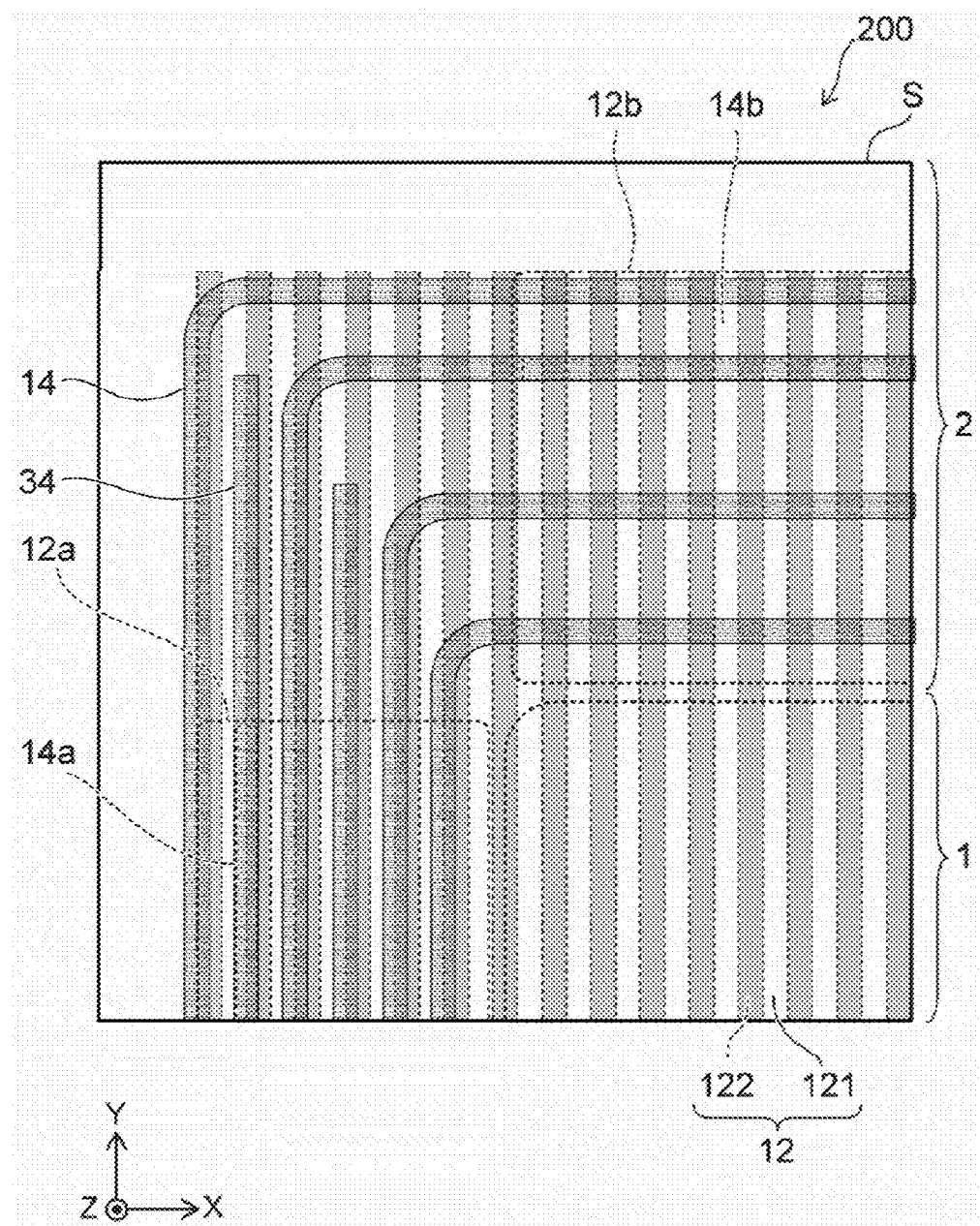
FIG. 5 is a plan view which illustrates a portion of a semiconductor device according to a second embodiment.

FIG. 5 is a plan view which illustrates a part of a semiconductor device 200 according to the second embodiment.

The semiconductor device 200 is different from the semiconductor device 100 in that the semiconductor device 200 further includes a field plate electrode 34.

As illustrated in FIG. 5, the field plate electrode 34 extends in the Y direction. The field plate electrode 34 is provided between the first portions 14a along the Y direction. On the other hand, the field plate electrode 34 is not provided between the second portions 14b.

The field plate electrode 34 is provided above an interface between the p-type pillar 122 and the n-type pillar 121, which is adjacent to the p-type pillar 122 in a direction toward the termination region 2 from the element region 1 (the X direction) in the same manner as the first portions 14a.

As described above, it is desirable that the field plate electrode 34 be provided above the junction interface between the n-type pillar 121 and the p-type pillar 122 in the region 12a.

On the other hand, when the p-type dopant concentration of the p-type pillar 122 is greater than the n-type dopant concentration of the n-type pillar 121, an interval (pitch) between equipotential lines is wider in a region close to the element region 1, and an interval between equipotential lines is narrower in a region farther from the element region 1 (in the region 12b). Therefore, it is desirable that an interval between the second portions 14b be set to be narrower in a region farther from the element region 1.

However, when an interval between equipotential lines is excessively narrow in a region of the region 12b farthest from the element region 1, it is difficult to provide the field plate electrodes 14 in accordance with the equipotential lines. This is because, when the field plate electrodes 14 are formed in proximity to each other, adjacent field plate electrodes 14 come into contact with each other.

In the exemplary embodiment, the field plate electrodes 34 some of the field plate electrodes 14. By providing the field plate electrodes 34, it is possible to provide the field plate electrodes 14 along the equipotential lines in the region 12a and the region 12b while providing field plate electrodes 34 above the junction interface between the n-type pillar 121 and the p-type pillar 122.

The exemplary embodiment may be used when the n-type dopant concentration of the n-type pillar 121 is higher than the p-type dopant concentration of the p-type pillar 122.

In addition, according to the exemplary embodiment, it is possible to suppress the lowering of the breakdown voltage in the semiconductor device 200 in the same manner as in the first embodiment.

Third Embodiment

A third embodiment will be described using FIGS. 6 and 7A and 7B.

Figure 6:
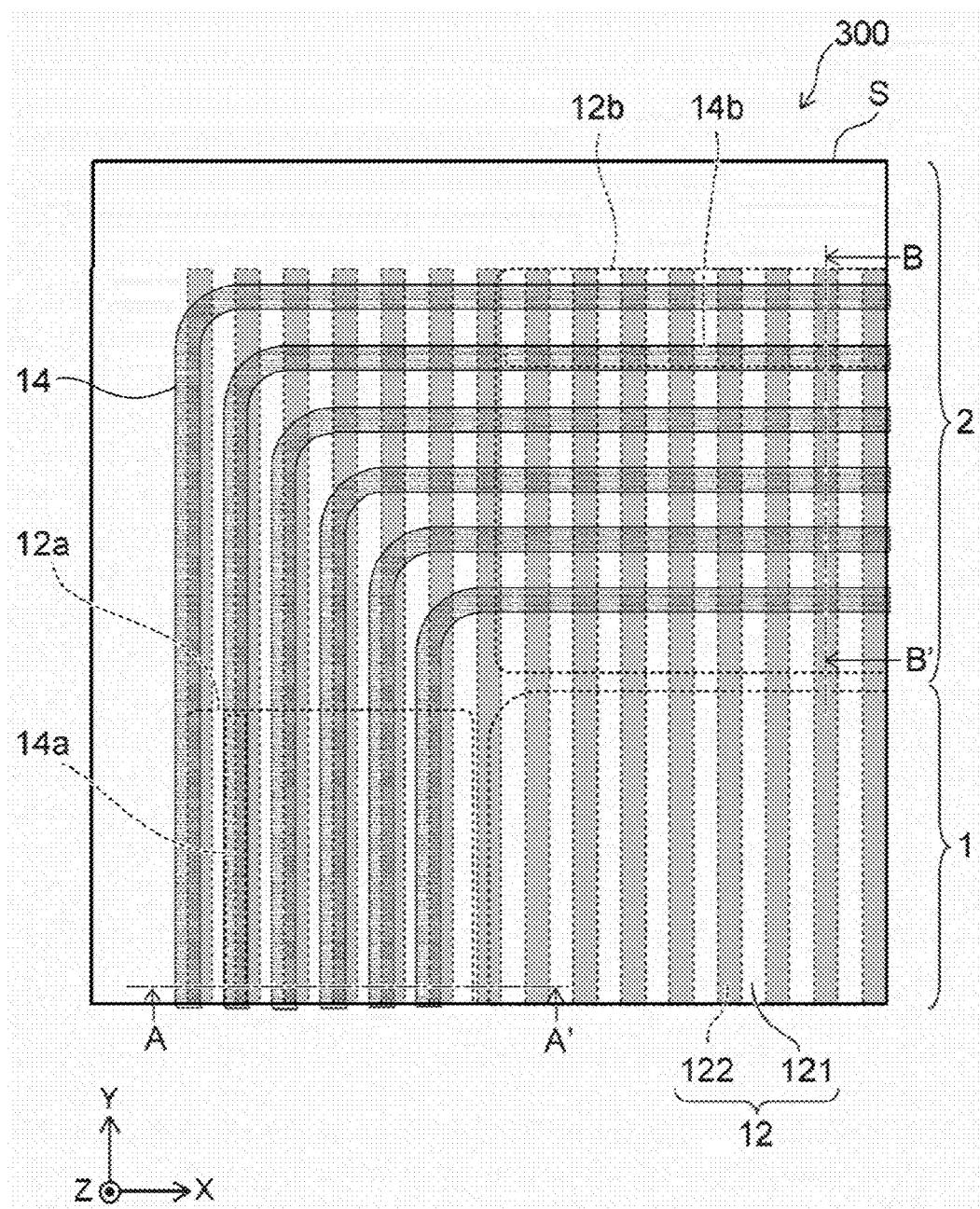
FIG. 6 is a plan view which illustrates a portion of a semiconductor device according to a third embodiment.

FIG. 6 is a plan view which illustrates a part of a semiconductor device 300 according to a third embodiment.

Figure 7A:
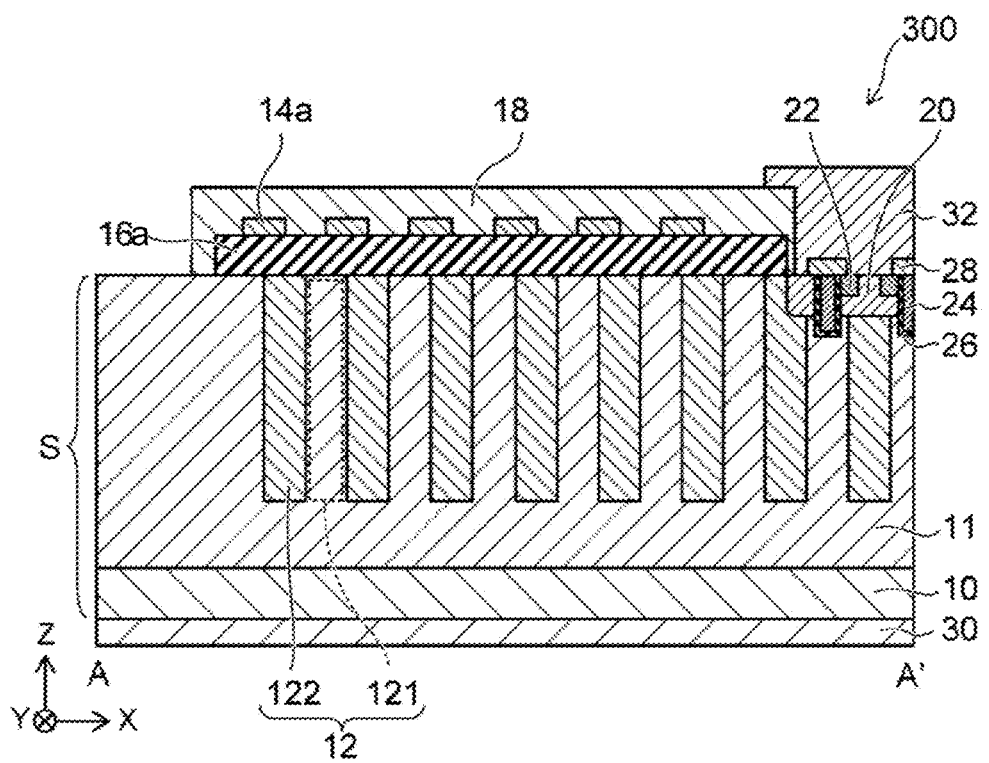
FIGS. 7A and 7B are cross-sectional views illustrating a portion of the semiconductor device according to the third embodiment.
Figure 7B:
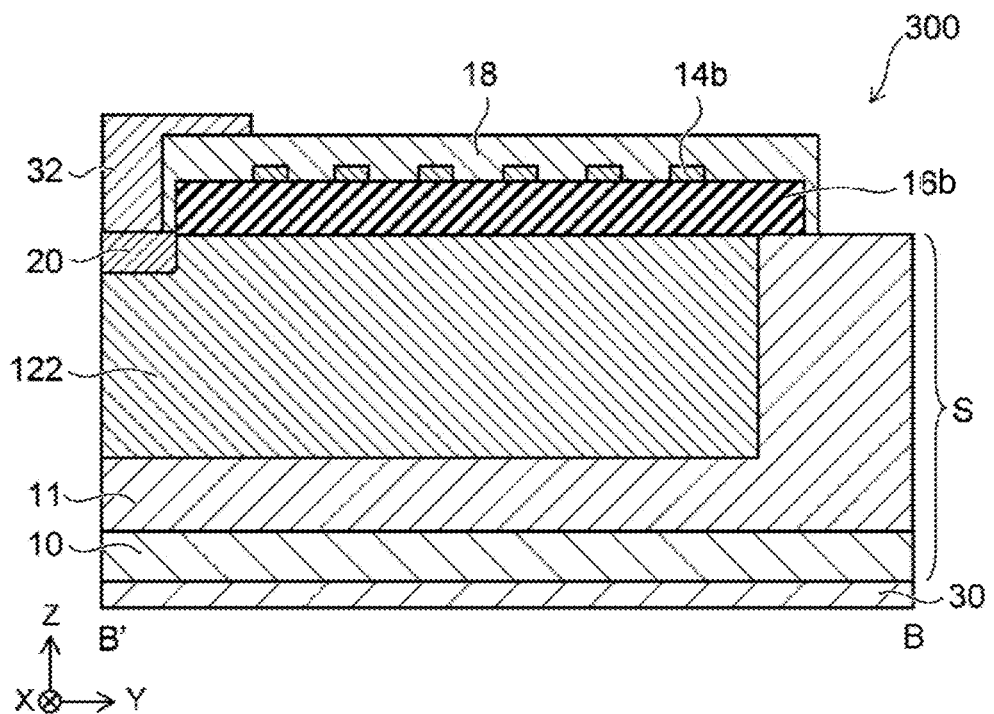

FIGS. 7A and 7B are cross-sectional views which illustrate a part of the semiconductor device 300 according to the third embodiment.

FIG. 7A is a cross-sectional view of FIG. 6 across section A-A' of FIG. 6, and FIG. 7B is a cross-sectional view of FIG. 6 across section B-B' of FIG. 6.

The semiconductor device 300 according to the exemplary embodiment is different from the semiconductor device according to the first embodiment in the structure of the field plate electrode 14 and the insulating layer 16.

Specifically, the first portions 14a of the field plate electrode 14 are provided at equal intervals (pitches) in the X direction. The second portions 14b are also provided at equal intervals (pitches) in the Y direction in the same manner as the first portions 14a. Moreover, the interval between adjacent first portions 14a in the X direction is equal to the interval between adjacent second portions 14b in the Y direction.

Then, a film thickness of an insulating portion 16b on which the second portions 14b are provided is thicker than a film thickness of an insulating portion 16a on which the first portions 14a are provided.

An example of a method of producing the insulating layer 16 according to the exemplary embodiment will be described with reference to FIGS. 8A to 8I.

FIGS. 8A and 8F and 8H-8I are schematic cross-sectional diagrams which illustrate a manufacture process of the semiconductor device 300 according to the exemplary embodiment.

In each of FIGS. 8A to 8C and 8I, figures on a left side of the page illustrate a manufacture process in a cross-section of FIG. 6 along section A-A' of FIG. 6, and figures on a right side of the page illustrate a cross-section of FIG. 6 along section B-B' of FIG. 6. FIG. 8G is a plan view of a process illustrated in FIGS. 8E and 8F.

Figure 8A:
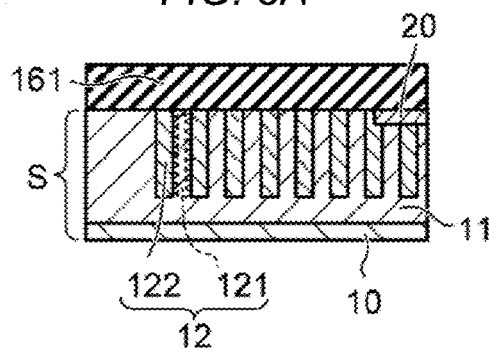
FIGS. 8A-8F, 8H and 8I are cross-sectional views which illustrate a manufacturing process of the semiconductor device according to the third embodiment.
Figure 8B:
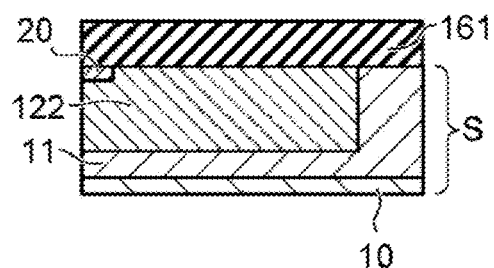

First, as illustrated in FIGS. 8A and 8B, an insulating layer 161 is formed in a uniform manner on the front surface of the substrate S.

Figure 8C:
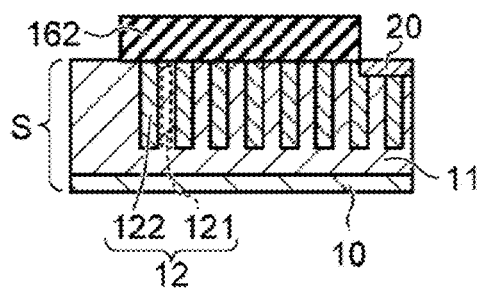
Figure 8D:
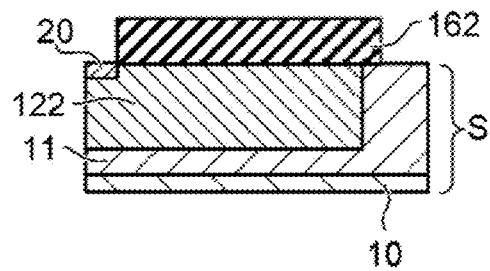

Then, as illustrated in FIGS. 8C and 8D, the insulating layer 161 is processed by using a photolithography method and an etching method to produce an insulating layer 162 which covers only the termination region 2 (peripheral portion of the semiconductor device 300).

Figure 8E:
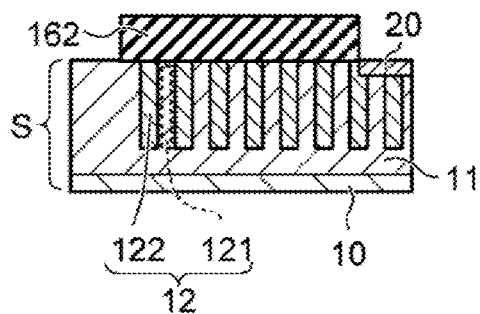
Figure 8F:
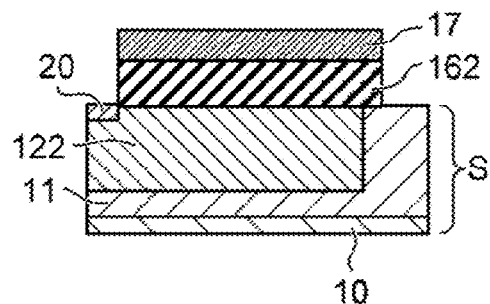
Figure 8G:
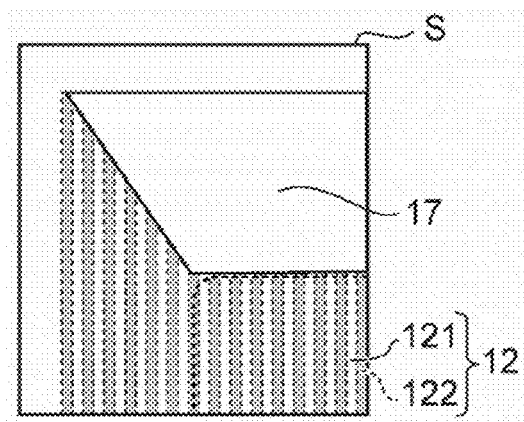
FIG. 8G is a schematic plan view of the semiconductor device of FIGS. 8E and 8F.

Then, as illustrated in FIGS. 8E and 8F, a mask 17 is formed on a region of the insulating layer 162 where the field plate electrodes 14 cross over adjacent n-type pillars 121 and the p-type pillars 122. A region in which the mask 17 is formed at this time is also illustrated in a plan view of FIG. 8G.

Figure 8H:
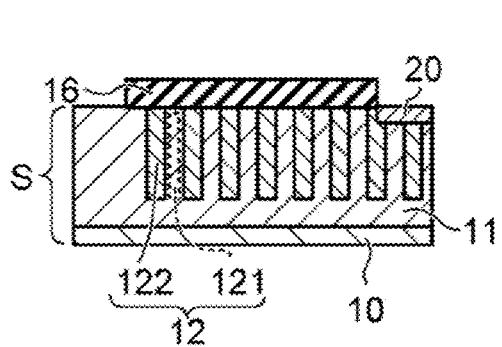
Figure 8I:
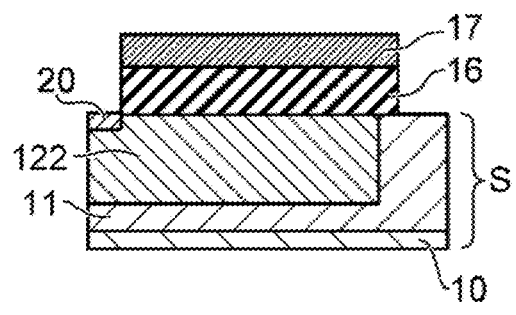

Then, as illustrated in FIGS. 8H and 8I, the insulating layer 16 (shown in FIGS. 7A and 7B) is obtained by etching a front surface of a region of the insulating layer 162 where the mask is not overlying in order to decrease a film thickness thereof.

As shown in FIGS. 7A and 7B, a film thickness of a portion 16b is thicker than a film thickness of a portion 16a, and thereby a distance between the second portion 14b and the region 12b is larger than a distance between the first portion 14a and the region 12a.

At this time, a potential of the field plate electrode 14 is greatly affected by a potential due to the proximity of region 12a. That is, a potential difference between the field plate electrode 14 and the region 12a becomes small, and a potential difference between the field plate electrode 14 and the region 12b is increased.

However, since a distance between the second portion 14b and the region 12b is large, an electric field occurring between the second portion 14b and the region 12b becomes weak, as compared to a case when a film thickness of the portion 16a is equal to a film thickness of the portion 16b.

As a result, according to the exemplary embodiment, it is possible to suppress the lowering of the breakdown voltage in the semiconductor device 300 by reducing strength of the electric field occurring between the second portion 14b and the region 12b in the same manner as in the first embodiment.

Moreover, since a distance between the first portion 14a and the region 12a is less than a distance between the second portion 14b and the region 12b, it is possible to effectively shield an electric field in the interface between the n-type pillar 121 and the p-type pillar 122 from the periphery towards the inside thereof.

In an example of the third embodiment described above, an interval between adjacent first portions 14a in the X direction is equal to an interval between adjacent second portions 14b in the Y direction. However, the embodiment is not limited thereto, and the interval between at least two adjacent first portions 14a in the X direction may be narrower than the interval between at least two adjacent second portions 14b in the Y direction. Alternatively, the intervals between adjacent second portions 14b in the Y direction may be different, respectively.

Alternatively, in the same manner as in the second embodiment, the field plate electrode 34 may be provided between the first portions 14a.

By combining the first embodiment or the second embodiment and the exemplary embodiment, an electric field occurring between a field plate electrode and a semiconductor region is further reduced.

Fourth Embodiment

A fourth embodiment will be described with reference to FIGS. 9 and 10A and 10B.

Figure 9:
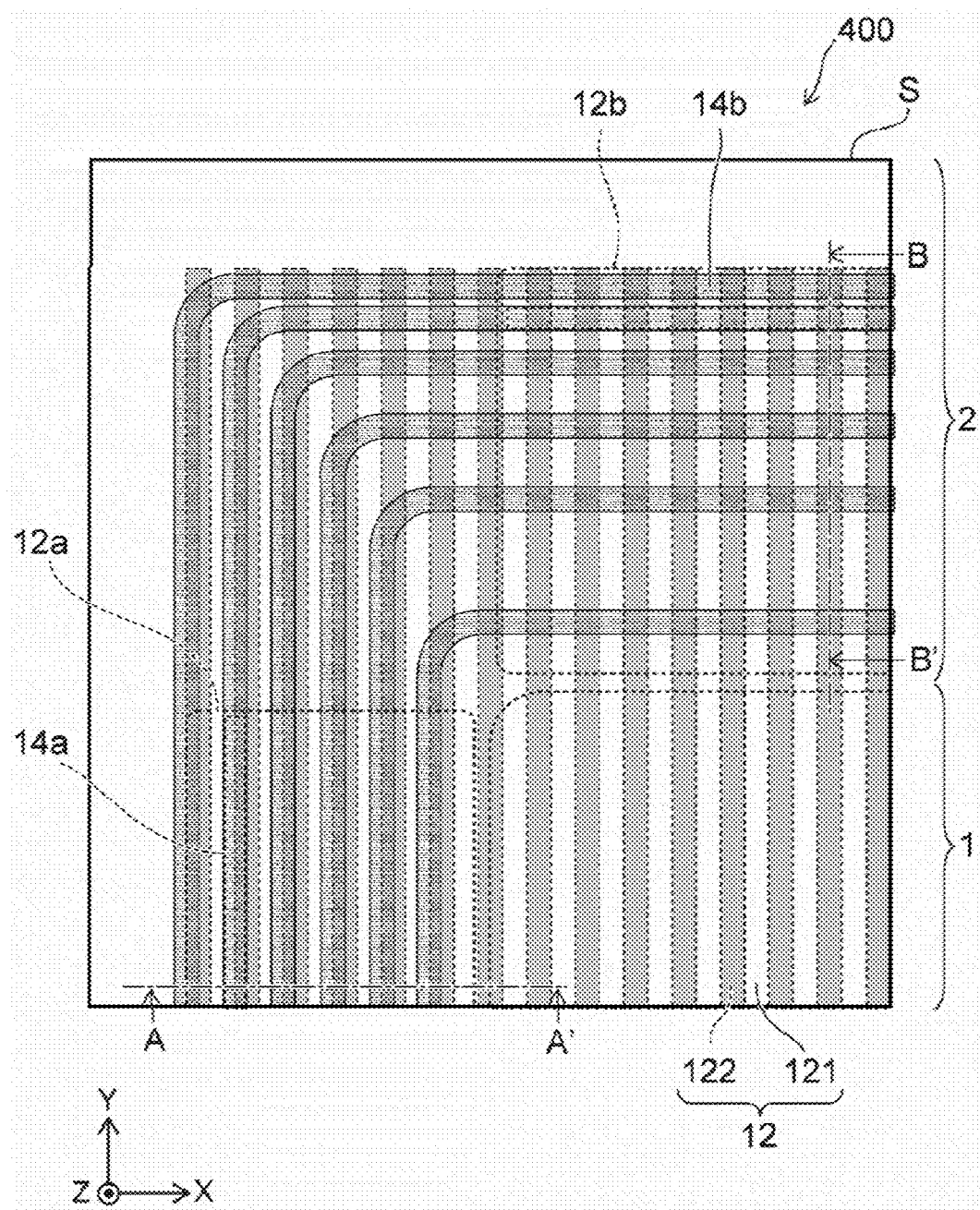
FIG. 9 is a plan view which illustrates a portion of a semiconductor device according to a fourth embodiment.

FIG. 9 is a plan view which illustrates a part of a semiconductor device 400 according to the fourth embodiment.

Figure 10A:
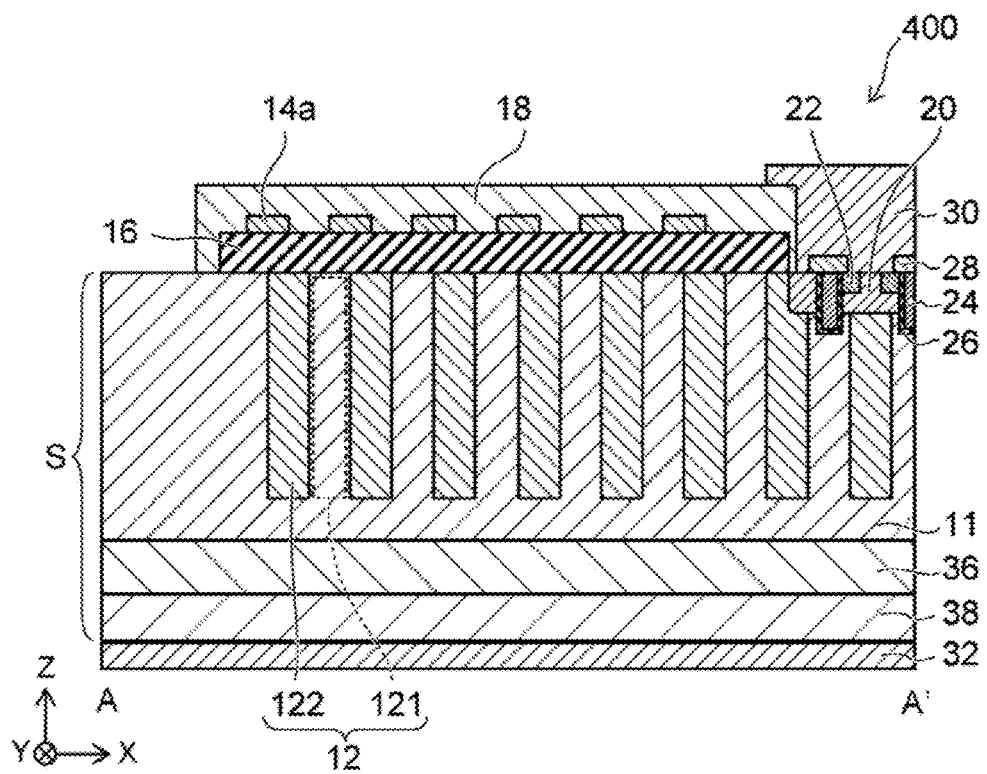
FIGS. 10A and 10B are cross-sectional views which illustrate apart of the semiconductor device according to the fourth embodiment.
Figure 10B:
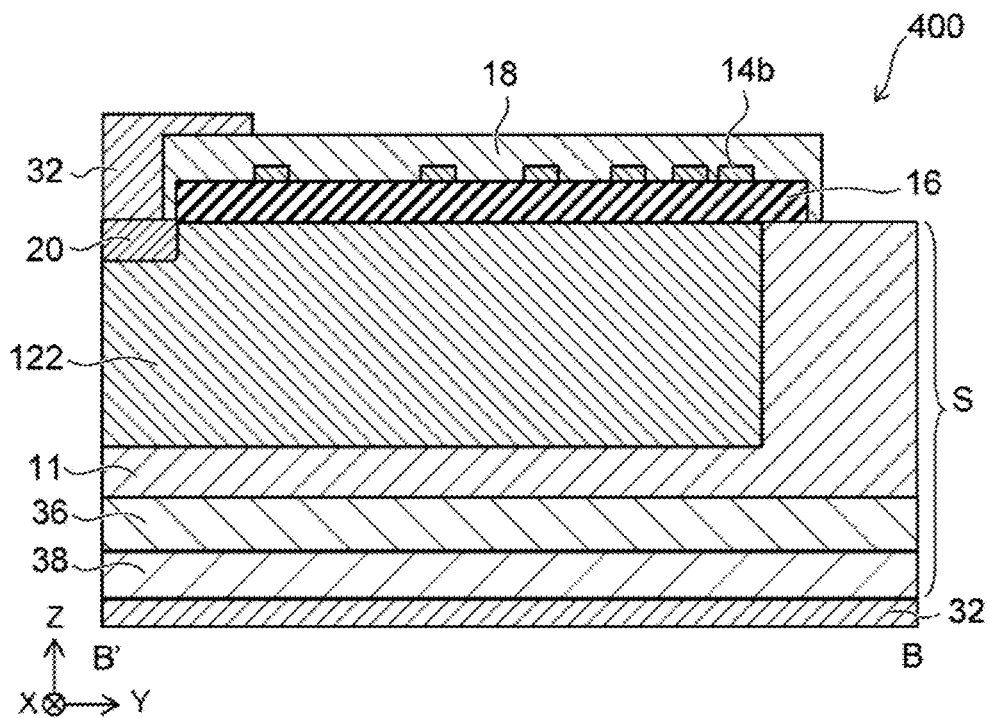

FIGS. 10A and 10B are cross-sectional views which illustrate a part of the semiconductor device 400 according to the fourth embodiment.

FIG. 10A is a cross-sectional view along line A-A' of FIG. 9, and FIG. 10B is a cross-sectional view along line B-B' of FIG. 9.

In FIGS. 9 and 10A and 10B, the same reference numerals used in FIGS. 2 and 3A and 3B are applied to elements which may adopt the same configuration as in the first embodiment, and a detailed description thereof is omitted for brevity.

The semiconductor device 400 according to the fourth embodiment includes, for example, an IGBT.

The semiconductor device 400 includes a buffer region 36 and a collector region 38 provided on the rear surface side of the substrate S instead of the drain layer 10 in the semiconductor device 100. Moreover, the semiconductor device 400 includes an emitter electrode 32 provided on the front surface of the substrate S. In addition, the semiconductor device 400 includes an emitter region layer 22 and a collector electrode 30 provided on the front surface side of the substrate S.

The buffer region 36 is an n-type semiconductor region. An n-type dopant concentration of the buffer region 36 is higher than an n-type dopant concentration of the n-type semiconductor region 11.

The collector region 38 is a p-type semiconductor region. A p-type dopant concentration of the collector region 38 is greater than an n-type dopant concentration of the n-type semiconductor region 11. The p-type dopant concentration of the collector region 38 is equal to, for example, the n-type dopant concentration of the buffer region 36.

The buffer region 36 is provided on the collector region 38.

The collector region 38 is electrically connected to the collector electrode 30. In addition, the emitter region layer 22 is electrically connected to the emitter electrode 32.

The n-type semiconductor region 11 is provided on the buffer region 36. The semiconductor region 12 is provided on the semiconductor region 11. The field plate electrode 14 is provided above the semiconductor region 12. In the field plate electrode 14, an interval in the X direction between at least two adjacent first portions 14a is less than an interval in the Y direction between at least two adjacent second portions 14b in the same manner as in the first embodiment.

According to the exemplary embodiment, in the same manner as in the first embodiment, it is possible to suppress the lowering of breakdown voltage in the semiconductor device.

In each embodiment described above, a so-called trench-type MOSFET or IGBT is described in which a gate electrode is provided in a trench. However, the exemplary embodiment is not limited thereto, but is also applicable to a so-called planar type MOSFET or IGBT in which the gate electrode is provided on a front surface of a semiconductor substrate in a planar manner.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first semiconductor region of a first conductivity type;
a plurality of second semiconductor regions of a second conductivity type extending inwardly of the first semiconductor region, each of the plurality of second semiconductor regions extending in a first direction, and arranged along a second direction crossing the first direction;
an element region that includes a third semiconductor region of the second conductivity type that is provided on the second semiconductor regions, a fourth semiconductor region of the first conductivity type that is selectively provided on the third semiconductor region, and a gate electrode disposed on a gate insulating layer that extends adjacent the third semiconductor region and the fourth semiconductor region; and
a termination region surrounding the element region and having a plurality of first electrodes that include respective first portions extending in the first direction and second portions extending in the second direction on the first semiconductor region and the second semiconductor region, wherein an interval between adjacent first portions in the second direction is less than an interval between adjacent second portions in the first direction.

2. The device according to claim 1,
wherein intervals between adjacent second portions in the first direction are different and at least one of the intervals between adjacent second portions in the first direction is greater than the interval between adjacent first portions in the second direction.

3. The device according to claim 2, further comprising:
a second electrode extending in the first direction and provided between adjacent first portions in the second direction.

4. The device according to claim 2, wherein
the first portions are at an equal interval in the second direction,
an interval in the first direction between at least two adjacent second portions is less than the interval between adjacent first portions in the second direction, and
an interval in the first direction between at least two adjacent second portions is greater than the interval between adjacent first portions in the second direction.

5. The device according to claim 1,
wherein an interval in the first direction between adjacent second portions is greater between the adjacent second portions that are closer to the fourth semiconductor region.

6. The device according to claim 5, further comprising:
a second electrode extending in the first direction and provided between adjacent first portions in the second direction.

7. The device according to claim 5, wherein
the first portions are at an equal interval in the second direction,
an interval in the first direction between at least two adjacent second portions is less than the interval between adjacent first portions in the second direction, and
an interval in the first direction between at least two adjacent second portions is greater than the interval between adjacent first portions in the second direction.

8. The device according to claim 1, further comprising:
a second electrode extending in the first direction and provided between adjacent first portions in the second direction.

9. The device according to claim 8, wherein
the first portions are at an equal interval in the second direction,
an interval in the first direction between at least two adjacent second portions is less than the interval between adjacent first portions in the second direction, and
an interval in the first direction between at least two adjacent second portions is greater than the interval between adjacent first portions in the second direction.

10. The device according to claim 1, wherein
the first portions are at an equal interval in the second direction,
an interval in the first direction between at least two adjacent second portions is less than the interval between adjacent first portions in the second direction, and
an interval in the first direction between at least two adjacent second portions is greater than the interval between adjacent first portions in the second direction.

11. A semiconductor device comprising:
a first semiconductor region of a first conductivity type;
a plurality of second semiconductor regions of a second conductivity type that are provided in the first semiconductor region in a second direction crossing a first direction, and extending in the first direction, and arranged along the second direction crossing the first direction;
an element region that includes a third semiconductor region of the second conductivity type that is provided on the second semiconductor regions, a fourth semiconductor region of the first conductivity type that is selectively provided on the third semiconductor region, and a gate electrode disposed on a gate insulating layer that extends adjacent the third semiconductor region and the fourth semiconductor region; and
a termination region having a plurality of first electrodes that include first portions extending in the first direction and second portions extending in the second direction on the first semiconductor region and the second semiconductor region, and an insulating layer that surrounds the element region and is provided between the first semiconductor region and the plurality of first electrodes, and between the second semiconductor region and the plurality of first electrodes, wherein a film thickness of a portion of the insulating layer overlying the second portion is thicker than a film thickness of the insulating layer overlying the first portion.

12. The device according to claim 11,
wherein intervals between adjacent second portions in the first direction are different and at least one of the intervals between adjacent second portions in the first direction is greater than the interval between adjacent first portions in the second direction.

13. The device according to claim 12, wherein
the first portions are at an equal interval in the second direction,
an interval in the first direction between at least two adjacent second portions is less than the interval between adjacent first portions in the second direction, and
an interval in the first direction between at least two adjacent second portions is greater than the interval between adjacent first portions in the second direction.

14. The device according to claim 11,
wherein an interval in the first direction between adjacent second portions is greater between the adjacent second portions that are closer to the fourth semiconductor region.

15. The device according to claim 11, further comprising:
an electrode in electrical contact with the first semiconductor layer.

16. A method for forming a semiconductor device, the method comprising:
forming a first semiconductor region of a first conductivity type;
forming a plurality of second semiconductor regions of a second conductivity type in the first semiconductor region, each of the plurality of second semiconductor regions extending in a first direction, and arranged along a second direction crossing the first direction;
forming an element region that includes a third semiconductor region of the second conductivity type on the second semiconductor region, a fourth semiconductor region of the first conductivity type that is selectively provided on the third semiconductor region, and a gate electrode that is disposed on a gate insulating layer that extends adjacent the third semiconductor region and the fourth semiconductor region; and
forming a termination region surrounding the element region and having a plurality of first electrodes that include respective first portions extending in the first direction and second portions extending in the second direction on the first semiconductor region and the second semiconductor region, wherein an interval between adjacent first portions in the second direction is less than an interval between adjacent second portions in the first direction.

17. The method according to claim 16, further comprising:
forming an insulating layer over the first portions and the second portions.

18. The method according to claim 17,
wherein a film thickness of a portion of the insulating layer overlying the second portion is thicker than a film thickness of the insulating layer overlying the first portion.

19. The method according to claim 16, further comprising:
forming a second electrode between adjacent first portions in the second direction.

20. The method according to claim 16, wherein
the first portions are at an equal interval in the second direction,
an interval in the first direction between at least two adjacent second portions is less than the interval between adjacent first portions in the second direction, and
an interval in the first direction between at least two adjacent second portions is greater than the interval between adjacent first portions in the second direction.

* * * * *